United States Patent [19]

Kayama

[11] Patent Number: 5,776,282
[45] Date of Patent: *Jul. 7, 1998

[54] METHOD OF PRODUCING CERAMIC GREEN SHEETS

[75] Inventor: Kazuo Kayama, Sagamihara, Japan

[73] Assignee: Murata Manufacturing Co., Ltd., Japan

[*] Notice: The term of this patent shall not extend beyond the expiration date of Pat. No. 5,603,793.

[21] Appl. No.: 611,621

[22] Filed: Mar. 6, 1996

Related U.S. Application Data

[62] Division of Ser. No. 340,419, Nov. 15, 1994, Pat. No. 5,520,994.

[30] Foreign Application Priority Data

Nov. 18, 1993 [JP] Japan ................................. 5-289278

[51] Int. Cl.⁶ ................................................. B32B 31/12
[52] U.S. Cl. ........................... 156/247; 156/289; 427/209
[58] Field of Search ......................... 156/242, 244.11, 156/246, 247, 306.3, 306.6, 308.2, 289; 427/209, 372.2, 430.1

[56] References Cited

U.S. PATENT DOCUMENTS

| | | |
|---|---|---|
| 4,716,068 | 12/1987 | Seifried et al. |
| 5,316,602 | 5/1994 | Kogame et al. ............. 156/277 X |
| 5,603,793 | 2/1997 | Yoshida et al. ............. 156/247 |

FOREIGN PATENT DOCUMENTS

| | | |
|---|---|---|
| 0348310 | 12/1989 | European Pat. Off. . |
| 3513526 | 10/1986 | Germany . |

OTHER PUBLICATIONS

English Language Abstract of Japanese Patent No. 05-008345, Jan. 19, 1993.
Patent Abstract of Japan, vol. 015, No. 452 (M-1180) & JP-A-03 193 441 (Taiyo Yuden Co. Ltd.) 23 Aug. 1991.
Database WPI, Week 9348, Derwent Publications Ltd., London, GB; AN 93-382738 & JP-A-5 286 084 (Toray Ind Inc.) 2 Nov. 1993.
English Language Abstract of Japanese Laid-Open Application No. 5-253,913 (Oct. 5, 1993).
English Language Abstract of Japanese Laid-Open Application No. 2-252,225 (Oct. 11, 1990).

*Primary Examiner*—Curtis Mayes
*Attorney, Agent, or Firm*—Ostrolenk, Faber, Gerb & Soffen, LLP

[57] ABSTRACT

A ceramic green sheet producing method which makes it possible to simultaneously produce two high-performance thin ceramic green sheets includes the steps of: coating both sides of a laminate film composed of two carrier films united into a laminate with a ceramic slurry; drying the ceramic slurry; and separating the two carrier films from each other to thereby obtain ceramic green sheets each supported by a carrier film. A release agent is applied to the obverse side of each carrier film, the reverse sides of the two carrier films being glued to each other.

12 Claims, No Drawings

METHOD OF PRODUCING CERAMIC GREEN SHEETS

RELATED APPLICATIONS

This is a division of parent application Ser. No. 08/340,419, filed Nov. 15, 1994, now U.S. Pat. No. 5,520,994 and entitled "LAMINATED CARRIER FILM FOR USE IN CERAMIC GREEN SHEET."

BACKGROUND OF THE INVENTION

1. Field of the Invention

The present invention relates to a method of producing ceramic green sheets using carrier films and, more specifically, to a method of producing ceramic green sheets useful in simultaneously producing two thin ceramic green sheets.

2. Description of the Related Art

A ceramic green sheet which is used for the production of a multi-layered ceramic substrate, a laminated ceramic capacitor, etc. is generally produced as follows: a container having a doctor blade is placed on a carrier film consisting of a plastic film (a polyester film, a polypropylene film, a polymethylpentene film or the like) alone or a carrier film formed by coating one side of such a carrier film with silicone. Then, a predetermined amount of a slurry containing a ceramic powder, a plasticizer, a binder, etc. is put in this container. When the carrier film is moved in a fixed direction, a green sheet (undried) having a thickness corresponding to the clearance between the doctor blade and the film is continuously formed on the carrier film. When this is dried, for example, with hot air or through an infrared heater, a ceramic green sheet is completed. This method allows utilization of the mechanical characteristics, flatness, etc. of the carrier film in the taking up of the green sheet and in the post treatments such as electrode printing and cutting, so that the method is advantageous in that it makes it possible to obtain a thinner green sheet. On the other hand, the method involves problems such as low productivity and high cost.

As another method in use, which helps to produce ceramic green sheets with higher productivity, a dipping method is available, which comprises the steps of: dipping a carrier film in a container containing a slurry composed of a ceramic powder, a plasticizer, a binder, etc.; performing levelling on the slurry coating of both surfaces of the carrier film while drawing it up so as to impart a fixed thickness thereto by using a quantitative comma roll or the like; and then drying the resulting coated film, for example, with hot air or through an infrared heater to thereby form a green sheet. However, in this method it is necessary to peel off the green sheet from the carrier film at the outlet of the drier and to take up the green sheet only. Further, since the strength and flatness of the green sheet itself has to be utilized in the subsequent treatments such as electrode printing and cutting, it is rather hard to thin the green sheet, thereby making it difficult to meet the recent requirement of thinning the green sheet.

The present inventor, who has been seeking a method which helps to eliminate the above problems to allow thin ceramic green sheets to be produced with high productivity, has found that thinner ceramic green sheets can be produced with a high productivity by coating both sides of a laminated film, composed of two carrier films united to form a laminate, with a ceramic slurry, drying this ceramic slurry, and then separating the two carrier films from each other to obtain ceramic green sheets each supported by a carrier film.

SUMMARY OF THE INVENTION

Accordingly, it is an object of the present invention to provide a method of producing ceramic green sheets useful for simultaneously producing two thin ceramic green sheets.

The object of the present invention can be achieved by applying a ceramic slurry to both sides of a laminate film composed of two carrier films united to form a laminate, drying the ceramic slurry, separating the two carrier films from each other to obtain ceramic green sheets each supported by a carrier film.

In the present invention, it is desirable for the two carrier films to be united to form a laminate through the intermediation of a core layer formed of an addition polymer or the like. Examples of the addition polymer include polyethylene, polypropylene, polyvinyl chloride resin, and vinylidene chloride resin. Of these, polyethylene is especially preferable from the viewpoint of lamination characteristics and mechanical characteristics.

Further, in the present invention, it is desirable for the carrier film to be formed of polyester. The polyester is a crystalline linear saturated polyester synthesized from an aromatic dibasic acid or ester forming derivative thereof and diol. More specifically, examples of the polyester include polyethylene terephthalate, polypropylene terephthalate, polybutylene terephthalate, and polyethylene-2,6-naphthalate.

It is possible for the polyester to contain an agent for improving the film properties. For example, it is desirable for the polyester to contain inorganic particles of calcium carbonate, kaolin, silicon oxide, or barium sulfate or precipitated particles formed from the residue of the catalyst used for the formation of the polyester to thereby form fine protrusions on the surface of the film or improve the lubricity thereof. Further, it is possible for the polyester to contain an antistatic agent such as sodium dodecylsulfonate, and pigment such as $TiO_2$ or $SiO_2$ as a hue adjusting agent. A polyester containing no such additives can also be naturally used.

It is desirable for the carrier film, formed of such a polyester, to be a biaxially oriented polyester film. This biaxially oriented polyester film can be produced by a conventionally known method. For example, it can be produced by drying and melting the polyester, extruding the melt onto a rotary cooling drum from a die (for example, a T-die or an I-die), rapidly cooling the extrudate to form an unstretched film, and biaxially stretching the unstretched film, followed by thermosetting. The thickness of the film is not particularly limited; it is preferably 5 to 250 μm.

Further, it is desirable that a release layer be formed on the surface of the carrier film of the present invention. The release layer can be roughly classified into a release layer for an organic solvent-based ceramic slurry and a release layer for an aqueous ceramic slurry.

When forming a release layer for an organic solvent-based ceramic slurry, it is advisable to use, as the release agent, a thermosetting silicone mainly composed of dimethylpolysiloxane (e.g., KS-776 or KS-847 supplied by the Shin-etsu Chemical Industry Co., Ltd., or TPR-6700 supplied by Toshiba Silicone K.K.).

When forming a release layer for an aqueous ceramic slurry, it is advisable to use, as the release agent, a silicone release agent comprising dimethyl polysiloxane and fine silica particles contained therein (e.g., SD-7230 or SD-723 supplied by Toray Dow Corning Silicone K.K.) or a modified silicone obtained by adding 1 to 10% by weight of dimethyl polysiloxane having a phenyl-substituted alkyl group at the terminal of the polymer to a mixture of an alkyd resin and a melamine resin (e.g., X-62-9022, KS-883 or KS-881 supplied by The Shin-etsu Chemical Industry Co., Ltd.).

The coating of the surface of the polyester layer with the release agent can be effected by spin coating, spray coating, bar coating, gravure coating, reverse coating, comma coating or the like. It is advisable to conduct the coating such that the dried film has a thickness of 0.05 to 1.0 μm.

As described above, the laminate film used in the ceramic green sheet production method of the present invention, which comprises two carrier films united to form a laminate, may be constructed such that polyester layers are formed on both sides of the polymer layer, with release layers being formed thereon. As to the adhesion between the polymer and polyester layers, it is preferably 1~8 g/25 mm, more preferably, 2~6 g/25 mm. This adhesion is measured as a peel strength and indicated in terms of a value peel strength. When this adhesion is less than 1 g/25 mm, the polymer and polyester layers are liable to be separated from each other during the handling of the carrier film. On the other hand, when the adhesion is higher than 8 g/25 mm, it is difficult to separate the polymer and polyester layers from each other with a ceramic green sheet formed on the release layer, which is undesirable. Generally speaking, it is desirable that the adhesion (peel strength) between the polymer and polyester layers be not greater than approximately half the adhesion (peel strength) between the release layer and the ceramic green sheet.

The laminate film used in the present invention can be formed, for example, as follows:

First, a coating solution of a release agent is applied to one side of a biaxially oriented polyester film, and then dried to form a polyester film (carrier film) with a release layer laminated on one side thereof. Two such carrier films are then prepared. The reverse side (non-release surface) of one of the carrier films is coated with an addition polymer. After drying, the other carrier film is glued to the coated surface such that the release surface of the film is on the outer side to thereby prepare a laminate film. In this laminate film, there is a difference in adhesion to the polymer layer between the two polyester films.

In another method, an addition polymer is melt-extruded for lamination onto the reverse side (non-release surface) of one the two carrier films prepared as described above. Immediately after this, the other carrier film is glued to the laminate surface such that the release surface of the film is on the outer side and then cooled to thereby prepare a laminate film. In this laminate film, there is no difference in adhesion to the polymer layer between the two polyester films. In this method, the adhesion between the polymer layer and the polyester film layer can be adjusted by the molecular weight of the addition polymer, the melt extrusion temperature, etc. For example, in the case of a core layer formed of polyethylene, melt-extrusion is performed at a temperature ranging from 250° to 260° C. for lamination on the reverse side of the polyester film. When the extrusion temperature is too high, the adhesion (peel strength) tends to increase, and when it is too low, the adhesion (peel strength) tends to decrease. In the case of a polyester layer of a low molecular weight type, the adhesion to the polyester layer is relatively high, and in the case of a polyester layer of a high molecular weight type, the adhesion to the polyester layer is relatively low.

Examples of the ceramic slurry to be applied to the laminate film in the ceramic green sheet production method of the present invention include an organic-solvent-based slurry containing barium titanate and polyvinyl butyral and using toluene-ethanol as the solvent, and a water-based slurry containing barium titanate, a water-soluble acrylic resin and starch.

Generally speaking, when applying this ceramic slurry to both sides of a laminate film, the film is immersed in a container containing the ceramic slurry, and, as the carrier film is drawn up, levelling is effected thereon with a metal bar, a doctor blade or the like to compensate for excessive coating with the ceramic slurry. Then, the carrier film is dried with a drier to evaporate the solvent to thereby obtain a green sheet.

Through separation from both sides of the polymer layer at the outlet of the drier, the ceramic green sheet thus obtained is divided into two ceramic green sheet each supported by a carrier film. Alternatively, the ceramic green sheet obtained is once taken up at the outlet of the drier and then divided into two ceramic green sheets each supported by a carrier film through separation from both sides of the polymer layer.

As described above, the laminate film used in the ceramic green sheet production method of the present invention undergoes the steps of applying ceramic slurry, drying, peeling off, taking up, etc., so that it naturally has the requisite mechanical properties as required in these steps. The thinner and the softer the polymer layer which constitutes the core layer, the better. A polymer layer which is hard and rigid is undesirable since it will involve separation from the polymer layer during use, making it impossible for the film to be used.

[EXAMPLES]

The present invention will be now described in more detail with reference to specific examples.

Example 1

A thermosetting silicone (KS-847 manufactured by The Shin-etsu Chemical Industry Co., Ltd.) was applied to one side of a polyester film (Tetron Film S, a trade name for a product, manufactured by Teijin Limited-25 μm) to a dry thickness of 0.2 μm to thereby prepare a carrier film one surface of which has undergone release treatment.

A high-density polyethylene (density: 0.956 g/cc, MI8.5, manufactured by Mitsubishi Chemical Industries Ltd.) was extruded onto the reverse side (non-release surface) of this carrier film to a thickness of 25 μm at a molten resin temperature of 250° to 260° C. Immediately after this, the reverse side of the other carrier film was brought into contact therewith and glued thereto by means of a cooling pressure roll to thereby obtain a laminate (laminate film) having a release layer on either side. The peel strength between the polyester surface and the polyethylene surface of the laminate was 2~3 g/25 mm.

A ceramic slurry was prepared by charging 100 parts by weight of a ceramic powder of barium titanate, 12 parts by weight of polyvinyl butyral, 8 parts by weight of dibutyl phthalate, and 20 parts by weight of toluene-ethyl alcohol into a ball mill and thoroughly kneading them.

This ceramic slurry was charged into a container and the above laminate film was immersed therein. Then, as the laminate film, with its both sides coated with the slurry, was drawn out, levelling was performed thereon by using a metal bar before it was subjected to drying for 4 minutes at 100° C. to thereby obtain a ceramic green sheet.

Separation between the polyester and polyethylene films was effected on this ceramic green sheet, which was done smoothly to provide two ceramic green sheets each having a polyester film. The peel strength between the ceramic green sheet and the release layer surface was 5 to 6 g/25 mm.

[Example 2]

One side of a polyester film (Tetron Film S, a trade name for a product manufactured by Teijin Limited-25 μm) was coated with a modified silicone (X-62-9022, manufactured by The Shin-etsu Chemical Industry, Co., Ltd.) to a thickness after drying of 0.2 μm to thereby prepare a carrier film with one side release treated.

A high-density polyethylene (MI6.5 with a density of 0.918 g/cc, manufactured by Nippon Unicar, Co., Ltd.) was extruded onto the other side (non-release surface) of this carrier film to a thickness of 25 μm at a molten resin temperature of 250° to 260° C., and, immediately after this, the reverse side (non-release surface) of the other carrier film was brought into contact with this and glued thereto by using a cooling pressure roll to thereby obtain a laminate (laminate film) having a release layer on either side. The peel strength between the polyester and polyethylene surfaces of the laminate was 5 to 6 g/25 mm.

A ceramic slurry was prepared by charging 100 parts by weight of barium titanate, 12 parts by weight of a water-soluble acrylic polymer, 8 parts by weight of polyethylene glycol and water into a ball mill and kneading them to a sufficient degree.

This ceramic slurry was put in a container, and the above laminate film was immersed therein. Then, as the laminate film, coated on both sides with the slurry, was pulled out, levelling was performed on the surfaces by using a metal bar, and, after a subsequent drying process, a ceramic green sheet was obtained.

Separation of the polyester and polyethylene films was effected on this ceramic green sheet, which separation was carried out smoothly, and two ceramic green sheets each having a polyester film were obtained. The peel strength between the ceramic green sheet and the release layer surface was 12 g/25 mm.

[Comparative Example 1]

The same processes as those of Example 2 were conducted except that the temperature of the molten resin when low density polyethylene was extruded onto the back side of the same release-treated film as that obtained in Example 2, was 320° C. The peel strength between the polyester and polyethylene surfaces was 10 g/25 mm.

A laminate was coated with the ceramic slurry in the same manner as in Example 2 and dried to thereby obtain a ceramic green sheet.

Separation of the polyester film and the polyethylene surface on this ceramic green sheet resulted on separation of the ceramic green sheet from the polyester film surface occurring here and there to make any post treatment impossible.

In accordance with the present invention, it is possible to provide a ceramic green sheet producing method useful in simultaneously producing two high-performance thin ceramic green sheets. The ceramic green sheets prove useful, for example, when used in producing ceramic electronic parts by performing electrode printing, lamination and sintering thereon.

What is claimed is:

1. A ceramic green sheet producing method comprising the steps of:

coating both sides of a laminate film, composed of two carrier films united into a laminate, with a ceramic slurry;

drying the ceramic slurry; and separating the two carrier films from each other to thereby obtain ceramic green sheets each supported by a carrier film.

2. A ceramic green sheet producing method according to claim 1, wherein said carrier films are formed of polyester.

3. A ceramic green sheet producing method according to claim 2, wherein a release agent is applied to the obverse side of said carrier films, the reverse sides of said two carrier films being glued to each other.

4. A ceramic green sheet producing method according to claim 1, wherein a release agent is applied to the obverse side of said carrier films, the reverse sides of said two carrier films being glued to each other.

5. A ceramic green sheet producing method comprising the steps of:

coating both sides of a laminate film, composed of two carrier films united into a laminate through the intermediation of a core layer having adhesiveness, with a ceramic slurry;

drying the ceramic slurry; and separating the two carrier films from each other to thereby obtain ceramic green sheets each supported by a carrier film.

6. A ceramic green sheet producing method according to claim 5, wherein said two carrier films are united into a laminate through the intermediation of a core layer formed of an addition polymer.

7. A ceramic green sheet producing method according to claim 6, wherein said carrier films are formed of polyester.

8. A ceramic green sheet producing method according to claim 7, wherein a release agent is applied to the obverse side of said carrier films, the reverse sides of said two carrier films being glued to each other.

9. A ceramic green sheet producing method according to claim 6, wherein a release agent is applied to the obverse side of said carrier films, the reverse sides of said two carrier films being glued to each other.

10. A ceramic green sheet producing method according to claim 5, wherein said carrier films are formed of polyester.

11. A ceramic green sheet producing method according to claim 10, wherein a release agent is applied to the obverse side of said carrier films, the reverse sides of said two carrier films being glued to each other.

12. A ceramic green sheet producing method according to claim 5, wherein a release agent is applied to the obverse side of said carrier films, the reverse sides of said two carrier films being glued to each other.

* * * * *